(12) United States Patent
Hsin et al.

(10) Patent No.: US 10,163,997 B2
(45) Date of Patent: Dec. 25, 2018

(54) OLED ARRAY SUBSTRATE, MANUFACTURING METHOD THEREOF, AND DISPLAY APPARATUS

(71) Applicant: BOE TECHNOLOGY GROUP CO., LTD., Beijing (CN)

(72) Inventors: Lungpao Hsin, Beijing (CN); Chinlung Liao, Beijing (CN); Meili Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/320,506

(22) PCT Filed: Nov. 17, 2015

(86) PCT No.: PCT/CN2015/094757
§ 371 (c)(1),
(2) Date: Dec. 20, 2016

(87) PCT Pub. No.: WO2016/107313
PCT Pub. Date: Jul. 7, 2016

(65) Prior Publication Data
US 2017/0186828 A1    Jun. 29, 2017

(30) Foreign Application Priority Data
Dec. 31, 2014   (CN) .......................... 2014 1 0851459

(51) Int. Cl.
*H01L 27/32*    (2006.01)
*H01L 21/02*    (2006.01)
(Continued)

(52) U.S. Cl.
CPC .... *H01L 27/3262* (2013.01); *H01L 21/02565* (2013.01); *H01L 27/1225* (2013.01);
(Continued)

(58) Field of Classification Search
None
See application file for complete search history.

(56) References Cited

U.S. PATENT DOCUMENTS

| | | |
|---|---|---|
| 5,793,457 A | 8/1998 | Tamai et al. |
| 7,754,275 B2 | 7/2010 | Mitsuhashi et al. |
| (Continued) | | |

FOREIGN PATENT DOCUMENTS

| | | |
|---|---|---|
| CN | 1429051 A | 7/2003 |
| CN | 101076211 A | 11/2007 |
| (Continued) | | |

OTHER PUBLICATIONS

International Search Report dated Feb. 17, 2016 issued in corresponding International Application No. PCT/CN2015/094757.
(Continued)

*Primary Examiner* — Lex Malsawma
(74) *Attorney, Agent, or Firm* — Nath, Goldberg & Meyer; Joshua B. Goldberg; Daniel Bissing

(57) ABSTRACT

The present invention discloses an OLED array substrate and a manufacturing method thereof, a display apparatus. The OLED array substrate includes a TFT and an OLED. The method includes: forming an oxide semiconductor layer by a film forming process, and performing one patterning process on the oxide semiconductor layer to form an active layer of the TFT and a first electrode of the OLED; sequentially forming a first insulating layer and a second insulating layer on the active layer and the first electrode of the OLED, the first insulating layer being a lyophilic layer, and the second insulating layer being a lyophobic layer; forming an accommodation cavity exposing the first electrode by performing a patterning process on the first and second insulating layers; and injecting, into the accommodation cavity,
(Continued)

and drying a solution containing an organic light emitting material to form an organic light emitting material layer.

18 Claims, 4 Drawing Sheets

(51) Int. Cl.
*H01L 51/56* (2006.01)
*H01L 27/12* (2006.01)
*H01L 29/66* (2006.01)
*H01L 29/786* (2006.01)
*H01L 51/00* (2006.01)
*H01L 51/52* (2006.01)

(52) U.S. Cl.
CPC ...... *H01L 27/3246* (2013.01); *H01L 27/3248* (2013.01); *H01L 29/66969* (2013.01); *H01L 29/7869* (2013.01); *H01L 51/56* (2013.01); *H01L 51/0003* (2013.01); *H01L 51/0005* (2013.01); *H01L 51/0023* (2013.01); *H01L 51/5206* (2013.01); *H01L 51/5221* (2013.01); *H01L 2227/323* (2013.01); *H01L 2251/303* (2013.01)

(56) References Cited

U.S. PATENT DOCUMENTS

| 7,791,269 | B2 | 9/2010 | Seki | |
|---|---|---|---|---|
| 9,660,192 | B2 | 5/2017 | Ren | |
| 2007/0269621 | A1* | 11/2007 | Mitsuhashi | H01L 27/3246 428/34.1 |
| 2016/0013415 | A1* | 1/2016 | Ren | H01L 51/5271 257/40 |

FOREIGN PATENT DOCUMENTS

| CN | 102651455 A | 8/2012 |
|---|---|---|
| CN | 103681773 A | 3/2014 |
| CN | 104538351 A | 4/2015 |

OTHER PUBLICATIONS

Office Action dated Dec. 1, 2016 issued in corresponding Chinese Application No. 201410851459.2.

Chinese office action dated Nov. 28, 2017 for corresponding CN application 201410851459.2 with English translation attached.

* cited by examiner

OLED ARRAY SUBSTRATE, MANUFACTURING METHOD THEREOF, AND DISPLAY APPARATUS

This is a National Phase Application filed under 35 U.S.C. 371 as a national stage of PCT/CN2015/094757, filed Nov. 17, 2015, an application claiming the benefit of Chinese Application No. 201410851459.2, filed Dec. 31, 2014, the content of each of which is hereby incorporated by reference in its entirety.

TECHNICAL FIELD

The present invention relates to the field of display technology, and particularly relates to an organic light emitting diode array substrate, an organic light emitting diode display apparatus, and a manufacturing method of the organic light emitting diode array substrate.

BACKGROUND

Organic light emitting diodes (OLEDs), due to their characteristics such as self-luminous property, quick response, rich colors and the like, have gradually become important display devices. In the prior art, an OLED array substrate has a complicated structure, and generally includes structures of thin film transistors and OLEDs, wherein various structures, such as gates, sources and drains of the thin film transistors and cathodes and anodes of the OLEDs, need to be formed by many patterning processes. As a result, manufacturing process of the OLED array substrate is complicated.

In addition, it is extraordinarily important to form an even and stable organic light emitting material layer in an OLED. Especially in the case of using an inkjet printing technique, defects such as Mura may occur once an ink droplet of the organic light emitting material fails to spread evenly in an ink droplet accommodation unit. This may decrease yield of OLED array substrate products.

SUMMARY

An object of the present invention is to provide an organic light emitting diode array substrate which is manufactured easily and has higher yield.

An object of the present invention also includes providing a manufacturing method of the organic light emitting diode array substrate and an organic light emitting diode display apparatus including the organic light emitting diode array substrate.

To achieve the above objects, technical solutions of the present invention are implemented by the following implementations.

Embodiments of the present invention provides a manufacturing method of an organic light emitting diode array substrate, the organic light emitting diode array substrate including a thin film transistor and an organic light emitting diode, the method including steps of:

forming an oxide semiconductor layer by a film forming process, and performing one patterning process on the oxide semiconductor layer to form an active layer of the thin film transistor and a first electrode of the organic light emitting diode;

sequentially forming a first insulating layer and a second insulating layer on the active layer and the first electrode of the organic light emitting diode, the first insulating layer being a lyophilic layer, and the second insulating layer being a lyophobic layer;

forming an accommodation cavity exposing the first electrode by performing a patterning process on the first insulating layer and the second insulating layer; and injecting a solution containing an organic light emitting material into the accommodation cavity; and performing a drying process to form an organic light emitting material layer.

In an embodiment, after forming an accommodation cavity, and before the step of injecting a solution containing an organic light emitting material into the accommodation cavity; and performing a drying process to form an organic light emitting material layer, the manufacturing method further includes a step of:

performing an overexposure treatment on the first electrode formed in the same layer as the active layer through the accommodation cavity to improve conductivity thereof.

In an embodiment, wavelength of light used in the overexposure treatment is in the range of 200 nm to 400 nm, and time for the overexposure treatment is between 0.5 minutes to 2 minutes.

In an embodiment, a surface of the first electrode subjected to the overexposure treatment is lyophilic.

In an embodiment, the first insulating layer is an etch stop layer.

In an embodiment, an angle between liquid level of the solution containing the organic light emitting material and a plane in which a surface of the etch stop layer is located is smaller than 0 degree.

In an embodiment, material of the etch stop layer is silicon oxide or aluminum oxide.

In an embodiment, the second insulating layer is a pixel define layer.

In an embodiment, an angle between liquid level of the solution containing the organic light emitting material and a plane in which a surface of the pixel define layer is located is larger than 30 degrees.

In an embodiment, the pixel define layer is made of an organic fluoride material.

In an embodiment, thickness of the second insulating layer is smaller than ¼ of thickness of the first insulating layer.

In an embodiment, after forming the first insulating layer and before forming the second insulating layer, the manufacturing method further includes a step of:

forming a source and a drain on the first insulating layer such that the source and the drain are respectively electrically connected to the active layer through a first via hole and a second via hole in the first insulating layer, and the drain is electrically connected to the first electrode of the organic light emitting diode through a third via hole in the first insulating layer.

In an embodiment, before the step of forming an oxide semiconductor layer by a film forming process, and performing one patterning process on the oxide semiconductor layer to form an active layer of the thin film transistor and a first electrode of the organic light emitting diode, the manufacturing method further includes steps of:

forming a gate of the thin film transistor on a base substrate; and forming a gate insulating layer on the gate and a part of the base substrate that is not covered by the gate, the active layer and the first electrode being formed on the gate insulating layer.

In an embodiment, after the step of forming an oxide semiconductor layer by a film forming process, and performing one patterning process on the oxide semiconductor layer to form an active layer of the thin film transistor and a first electrode of the organic light emitting diode, and before forming the first insulating layer, the manufacturing method further includes:

forming a gate insulating layer on the active layer of the thin film transistor, the first electrode of the organic light emitting diode, and a part of a base substrate that is not covered by the active layer of the thin film transistor and the first electrode of the organic light emitting diode; and forming a gate on the gate insulating layer; wherein the source and the drain are respectively electrically connected to the active layer through a first via hole and a second via hole in the first insulating layer and the gate insulating layer, and the drain is electrically connected to the first electrode of the organic light emitting diode through a third via hole in the first insulating layer and the gate insulating layer, wherein in the step of forming an accommodation cavity exposing the first electrode by performing a patterning process on the first insulating layer and the second insulating layer, the patterning process is performed on the first insulating layer, the second insulating layer and the gate insulating layer to form the accommodation cavity exposing the first electrode.

In an embodiment, the gate insulating layer is lyophilic.

An embodiment of the present invention provides an organic light emitting diode array substrate, including:

a thin film transistor having an active layer;

an organic light emitting diode including a first electrode, a second electrode and an organic light emitting material layer disposed between the first electrode and the second electrode; and a first insulating layer and a second insulating layer sequentially formed from bottom to top above the active layer and the first electrode of the organic light emitting diode, the first insulating layer being a lyophilic layer, and the second insulating layer being a lyophobic layer; wherein the active layer and the first electrode of the organic light emitting diode are in a same layer and made of a same material; and an accommodation cavity exposing the first electrode to the organic light emitting material layer is formed in the first insulating layer and the second insulating layer, and the accommodation cavity is used for accommodating the organic light emitting material layer.

In an embodiment, the first insulating layer is an etch stop layer.

In an embodiment, material of the etch stop layer is silicon oxide or aluminum oxide.

In an embodiment, the second insulating layer is a pixel define layer.

In an embodiment, material of the pixel define layer is organic fluoride.

In an embodiment, thickness of the second insulating layer is smaller than ¼ of thickness of the first insulating layer.

In an embodiment, the thin film transistor further includes:

a source and a drain above the first insulating layer, wherein the source and the drain are respectively electrically connected to the active layer through a first via hole and a second via hole in the first insulating layer, and the drain is electrically connected to the first electrode of the organic light emitting diode through a third via hole in the first insulating layer;

a gate above or below the active layer; and a gate insulating layer between the active layer and the gate.

In an embodiment, the organic light emitting diode array substrate further includes a base substrate, wherein the gate is on the base substrate, and the gate insulating layer is arranged to separate the gate and a part of the base substrate that is not covered by the gate from the active layer and the first electrode.

In an embodiment, the organic light emitting diode array substrate further includes a base substrate, wherein the active layer and the first electrode are on the base substrate, and the gate insulating layer is above the active layer and the first electrode and forms the accommodation cavity together with the first insulating layer and the second insulating layer.

Embodiments of the present invention further provide an organic light emitting diode display apparatus, including:

the organic light emitting diode array substrate of any one of the above embodiments.

For the above technical solutions of the present invention, in at least one aspect, the process can be simplified by forming one electrode of the organic light emitting diode and the active layer of the thin film transistor in the same layer, and flatness of the organic light emitting material layer can be improved by combining the lyophilic layer and the lyophobic layer, which can in turn improve manufacturing yield of organic light emitting diode array substrates.

DETAILED DESCRIPTION

Figure 1:
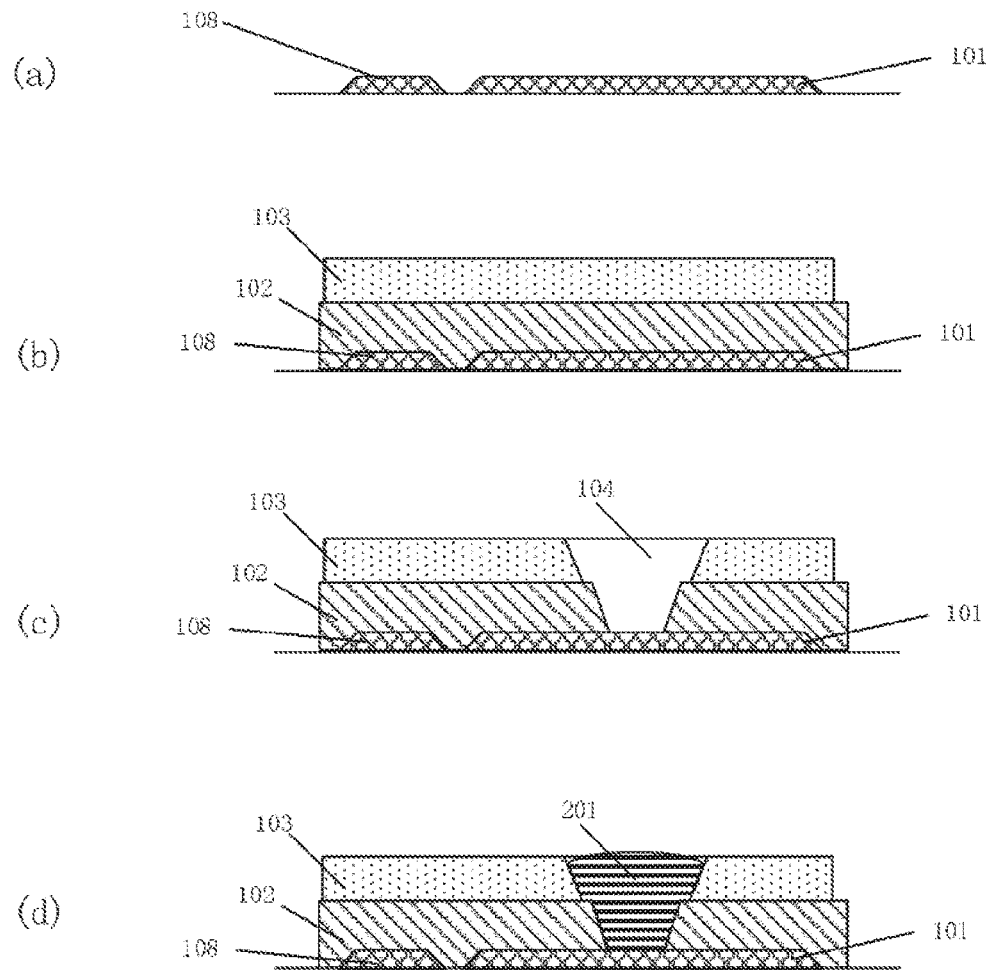
FIG. 1 is a schematic diagram of a manufacturing method of an OLED array substrate according to an embodiment of the present invention.

Technical solutions of the present invention will be described in detail below in conjunction with the embodiments and accompanying drawings. Throughout the description, same or similar reference numerals represent same or similar parts. The following description of implementations of the present invention with reference to the accompanying drawings is intended to explain the general inventive concept of the present invention, and shall not be construed as a limitation to the present invention.

Embodiments of the present invention provide a manufacturing method of an OLED array substrate including a thin film transistor and an OILED. In the manufacturing method, first, an oxide semiconductor layer is formed by a film forming process, and one patterning process is performed on the oxide semiconductor layer to form an active layer 108 of the thin film transistor and a first electrode 101 of the OLED, as shown in FIG. 1 (a). Then, a first insulating layer 102 and a second insulating layer 103 are sequentially formed on the active layer 108 and the first electrode 101 of the OLED, as shown in FIG. 1(b), the first insulating layer 102 is a lyophilic layer, and the second insulating layer 103 is a lyophobic layer. Subsequently, a patterning process is performed on the first insulating layer 102 and the second insulating layer 103 to form an accommodation cavity 104 exposing the first electrode 101, as shown in FIG. 1(c). Thereinafter, a solution containing an organic light emitting material is injected into the accommodation cavity 104 and dried to form an organic light emitting material layer 201, as shown in FIG. 1(d).

As the active layer 108 and the first electrode 101 are formed in a same layer by one patterning process, which includes, for example, deposition, photolithography, development, etch, etc., the manufacturing process of the OLED array substrate is obviously simplified. In the prior art, however, the active layer 108 and the first electrode 101 are formed in two patterning processes, and by contrast, the manufacturing method according to embodiments of the present invention can decrease the number of patterning processes during the whole manufacturing process of the OLED array substrate, and improve manufacturing efficiency and yield as well.

Figure 2:
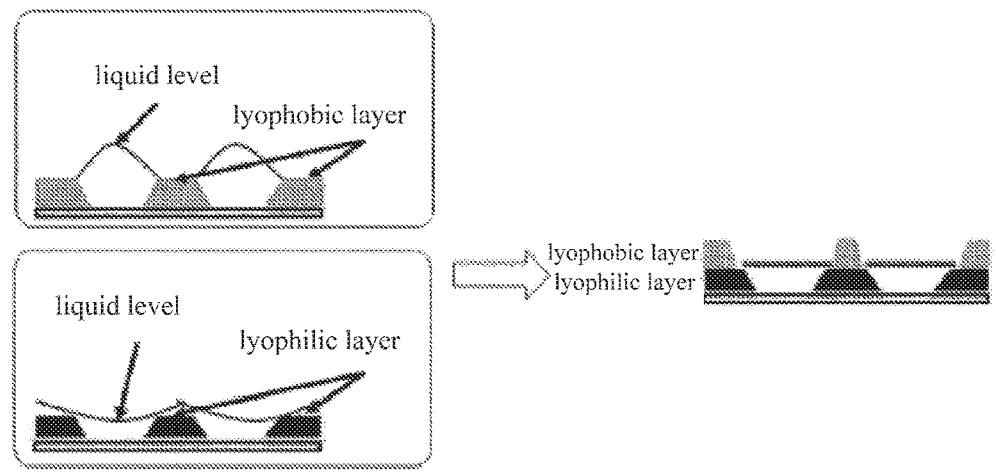
FIG. 2 is a schematic diagram illustrating influences of a lyophilic first insulating layer and a lyophobic second insulating layer on solution containing an organic light emitting material.

As described above, the first insulating layer 102 is a lyophilic layer, and the second insulating layer 103 is a lyophobic layer, which facilitate improving flatness of the organic light emitting material layer 201, especially in the case of using inkjet printing to form the organic light emitting material layer 201. Lyophilic and lyophobic properties of the first insulating layer 102 and the second insulating layer 103 for forming the accommodation cavity 104 have a significant influence on the flatness of a surface of the solution containing the organic light emitting material that is injected into the accommodation cavity 104. As shown in FIG. 2, in a case where the entire wall of the accommodation cavity 104 is formed by a lyophobic layer having a lyophobic surface, upper surface of the solution (e.g., in the form of an ink droplet) containing the organic light emitting material in the accommodation cavity 104 presents a convex shape (as shown in the top left figure in FIG. 2), and in a case where the entire wall of the accommodation cavity 104 is formed by a lyophilic layer having a lyophilic surface, the upper surface of the solution containing the organic light emitting material in the accommodation cavity 104 presents a concave shape (as shown in the lower left figure in FIG. 2), The obvious convex or concave shape may result in Mura during display. In the embodiments of the present invention, the wall of the accommodation cavity 104 is in the form of a combination of the lyophobic second insulating layer 103 and the lyophilic first insulating layer 102, in this manner, effects of the lyophilic layer and the lyophobic layer can be at least partially counteracted so that the upper surface of the droplet of the organic light emitting material in the accommodation cavity 104 tends to be flat, as shown in the right figure in FIG. 2. To achieve better effect, the second insulating layer 103 may be formed to have a thickness much smaller than that of the first insulating layer 102. For example, the thickness of the second insulating layer 103 does not exceed ¼ of the thickness of the first insulating layer 102. As an example, the thickness of the lyophobic second insulating layer 103 may be in the range of 200 nm to 500 nm, and the thickness of the lyophilic first insulating layer 102 may be in the range of 800 nm to 2000 nm.

Compared to a solution adopting either a single lyophilic layer or a single lyophobic layer, the structure combining a lyophilic layer and a lyophobic layer can improve flatness of the organic light emitting material layer in an OLED display apparatus, and allow the injected solution containing the organic light emitting material (e.g., droplets of organic light emitting material jetted from an inkjet printing apparatus) to uniformly spread in the accommodation cavity 104, so as to avoid Mura defect during display.

As an example, the solution containing the organic light emitting material may be aqueous liquid, the second insulating layer 103 may be a hydrophobic layer, and the first insulating layer 102 may be a hydrophilic layer.

Those skilled in the art should understand that a lyophilic layer is a layer whose surface has a strong affinity for liquid (the solution containing the organic light emitting material in the present application), or is apt to be wetted by the liquid. Accordingly, a lyophobic layer is a layer whose surface lacks affinity for liquid (the solution containing the organic light emitting material in the present application), or can hardly be wetted by the liquid. Lyophilic and lyophobic property of a layer may depend on material and surface treatment.

In the context, the lyophilic and lyophobic property of a layer may be represented by an angle between a plane in which a surface of the layer is located and liquid level of the liquid in the accommodation cavity. As an example, the angle between the liquid level of the solution containing the organic light emitting material and a plane in which the surface of the second insulating layer 103 is located may be larger than 30 degrees. As an example, the angle between the liquid level of the solution containing the organic light emitting material and a plane in which the surface of the first insulating layer 102 is located may be smaller than 0 degree.

For example, the second insulating layer 103 may be made of an organic fluorine material, an organic silicon material, an inorganic nano-material or a photosensitive material. The first insulating layer 102 may be made of, for example, silicon oxide, aluminum oxide, or an inorganic insulating layer. As an example, the second insulating layer 103 may be a pixel define layer. As an example, the first insulating layer 102 may be an etch stop layer.

In an embodiment, the oxide semiconductor layer may be a metal oxide layer, such as indium gallium zinc oxide (IGZO), gallium zinc oxide (GZO), indium zinc oxide (IZO), or the like. As an example, after forming the accommodation cavity 104, and before the solution containing the organic light emitting material is injected into the accommodation cavity 104 and dried to form the organic light emitting material layer 201, an overexposure treatment may be performed, through the accommodation cavity 104, on the first electrode 101 formed in the same layer as the active layer 108 to improve its conductivity, for example, to better match work functions of other materials in the OLED. The first electrode 101 not only may be formed in the same layer as the active layer 108 but also may be formed in the same layer as other functional layer(s) that can be formed from the oxide semiconductor layer to further simplify the process.

As an example, wavelength of light used in the above overexposure treatment may be in the range of 200 nm to 400 nm, and treating time may be between 0.5 minutes to 2 minutes. As an example, the surface of the first electrode 101 subjected to the overexposure treatment may have lyophilic property. As an example, the second insulating layer 103 may be a pixel define layer. The pixel define layer 103 may be made of, for example, an organic fluorine material, an organic silicon material, an inorganic nano-material or a photosensitive material. As an example, the first insulating layer 102 may be an etch stop layer. The etch stop layer 102 may be made of, for example, silicon oxide, aluminum oxide, or an inorganic insulating layer.

As an example, after forming the first insulating layer (e.g., the etch stop layer) 102, and before forming the second insulating layer 103, the manufacturing method of an OLED array substrate according to an embodiment of the present invention may further include: forming a source 109 and a drain 110 on the first insulating layer 102, the source 109 and the drain 110 are respectively electrically connected to the active layer 108 through a first via hole 139 and a second via hole 140 both penetrating through the first insulating layer 102, and the drain 110 is also electrically connected to the first electrode 101 through a third via hole 141 penetrating through the first insulating layer 102. Thus, parts of the thin film transistor other than the active layer 108 can be formed conveniently.

Figure 3:
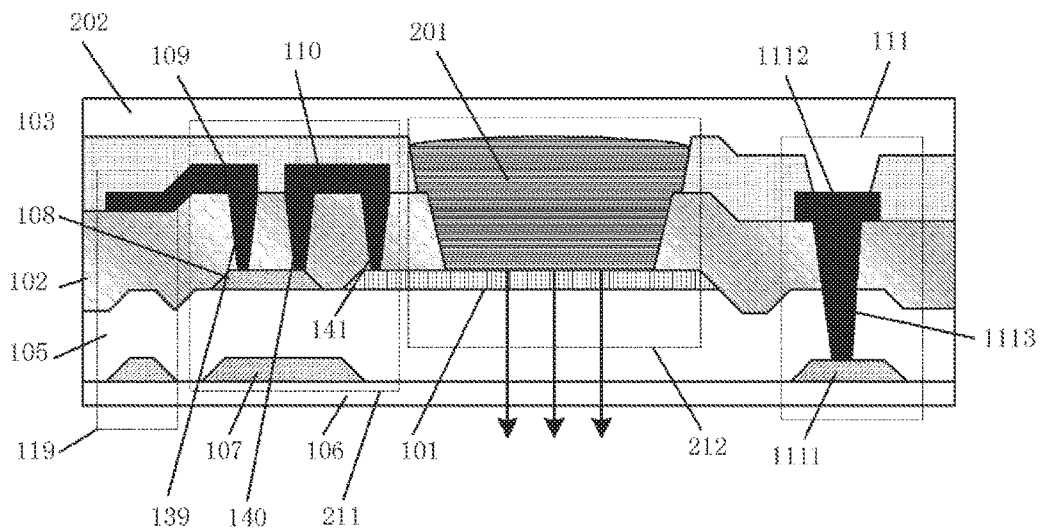
FIG. 3 is a schematic diagram of a part of an OLED array substrate including a bottom-gate thin film transistor and an OLED according to an embodiment of the present invention.
Figure 5:
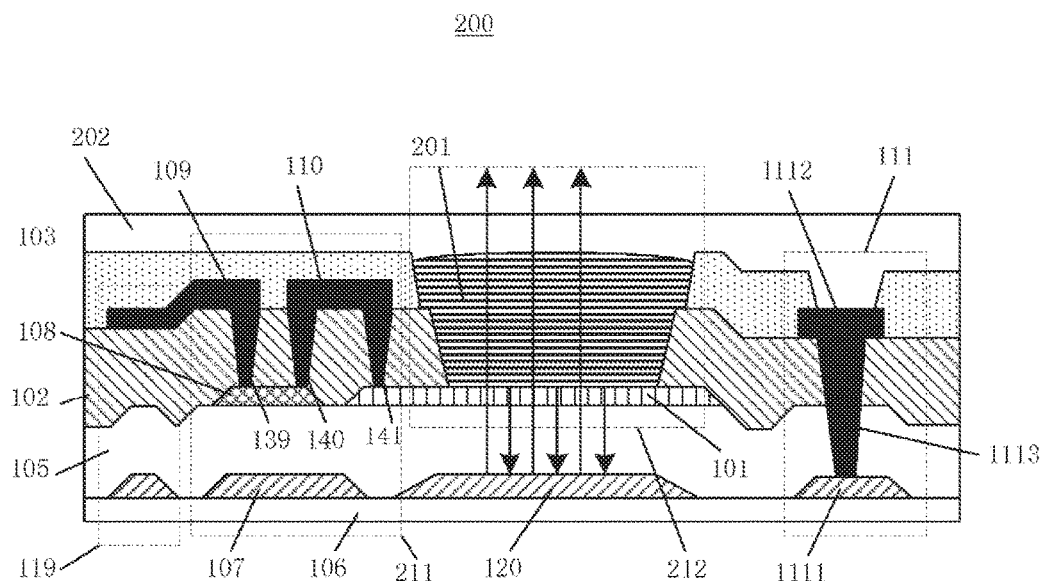
FIG. 5 is a schematic diagram of a top-emission OLED display unit according to an embodiment of the present invention.

As an example, before forming the active layer 108 of the thin film transistor and the first electrode 101 of the OLED, the manufacturing method of an OLED array substrate according to an embodiment of the present invention may further include: forming a gate 107 of the thin film transistor on a base substrate 106; and forming a gate insulating layer 105 on the gate 107 and a part of the base substrate 106 without the gate 107 covering thereon, the active layer 108 and the first electrode 101 being formed on the gate insulating layer 105. The OLED array substrate thus manufactured is a bottom-gate OLED array substrate 200, as shown in FIG. 3. As an example, a reflective layer 120 may be formed at a position on the base substrate 106 corresponding to the accommodation cavity 104 while forming the gate 107 on the base substrate 106, that is, the reflective layer 120 may be formed in the same layer as the gate 107, so that a top-emission OLED array substrate 200 is formed without increasing the number of patterning processes, as shown in FIG. 5.

Figure 4:
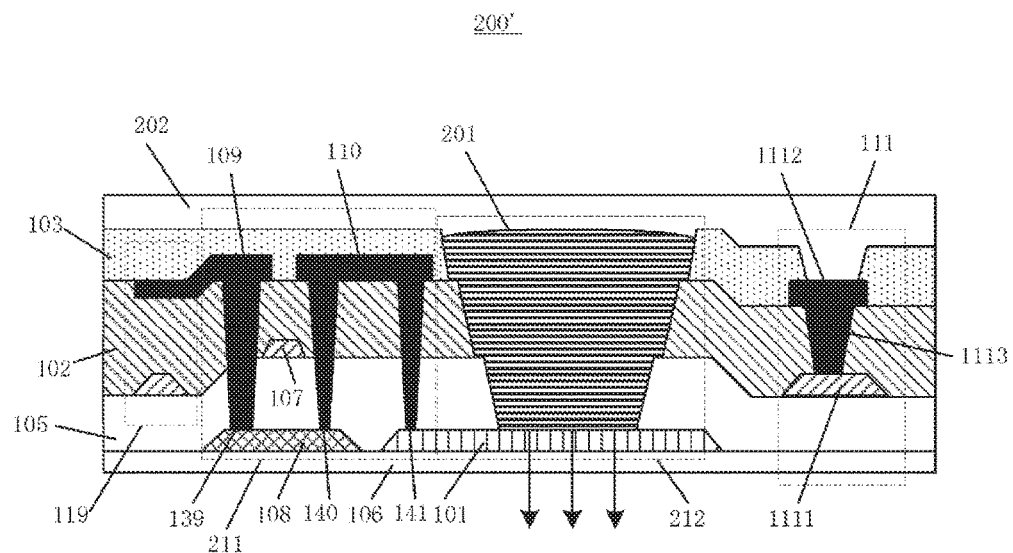
FIG. 4 is a schematic diagram of a part of an OLED array substrate including a top-gate thin film transistor and an OLED according to an embodiment of the present invention.

Alternatively, as an example, after forming the active layer 108 of the thin film transistor and the first electrode 101 of the OLED, and before forming the first insulating layer (e.g., the etch stop layer) 102, the manufacturing method of an OLED array substrate according to an embodiment of the present invention may further include: forming a gate insulating layer 105 on the active layer 108 of the thin film transistor, the first electrode 101 of the OLED, and a part of the base substrate without the active layer 108 of the thin film transistor and the first electrode 101 of the OLED covering thereon; forming a gate 107 on the gate insulating layer 105; the source and the drain are respectively electrically connected to the active layer 108 through a first via hole 139 and a second via hole 140 both penetrating through the first insulating layer 102 and the gate insulating layer 105, and the drain is also electrically connected to the first electrode 101 of the OLED through a third via hole 141 penetrating through the first insulating layer 102 and the gate insulating layer 105. In the step of performing a patterning process on the first insulating layer 102 and the second insulating layer 103 to form an accommodation cavity 104 exposing the first electrode, the patterning process is performed on the gate insulating layer 105, the first insulating layer 102 and the second insulating layer 103 to form the accommodation cavity 104 exposing the first electrode. The manufactured OLED array substrate is a top-gate OLED array substrate 200', as shown in FIG. 4. In this example, the gate insulating layer 105 may be, for example, a lyophilic layer.

Figure 6:
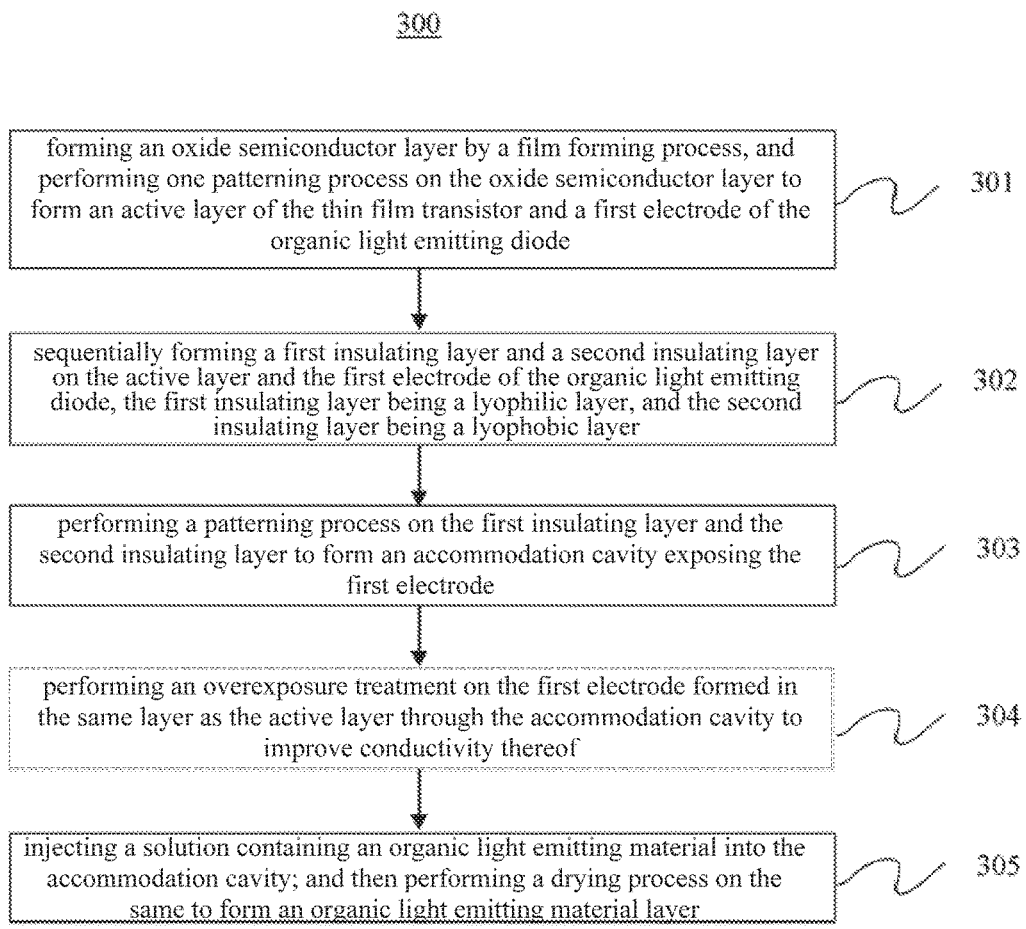
FIG. 6 is a flowchart schematically illustrating a manufacturing method of an OLED display unit according to an embodiment of the present invention.

FIG. 6 illustrates a schematic flowchart of a manufacturing method of an OLED display unit according to an embodiment of the present invention. As described above, the manufacturing method 300 of an OLED display unit may include:

step 301 of forming an oxide semiconductor layer by a film forming process, and performing one patterning process on the oxide semiconductor layer to form an active layer of the thin film transistor and a first electrode of the organic light emitting diode;

step 302 of sequentially forming a first insulating layer and a second insulating layer on the active layer and the first electrode of the OLED, the first insulating layer being a lyophilic layer, and the second insulating layer being a lyophobic layer;

step 303 of performing a patterning process on the first insulating layer and the second insulating layer to form an accommodation cavity exposing the first electrode; and step 305 of injecting a solution containing an organic light emitting material into the accommodation cavity; and performing a drying process to form an organic light emitting material layer.

By using the manufacturing method in the embodiment of the present invention, not only can the first electrode and the active layer be formed by one patterning process, but also compared to a case in which the first electrode and the active layer are formed in two different layers, an insulating layer for separating the two layers can be omitted, which further simplifies the process. In addition, when forming the accommodation cavity, the first insulating layer and the second insulating layer may be etched together to further simplify the process.

As an example, between step 303 and step 305, optional step 304 (shown by the dashed box in FIG. 6) of performing an overexposure treatment on the first electrode formed in the same layer as the active layer through the accommodation cavity to improve conductivity thereof may be further included.

Embodiments of the present invention further provide an OLED array substrate, and the OLED array substrate 200 may include: a thin film transistor 211 having an active layer 108; an OLED 212 including a first electrode 101, a second electrode 202 and an organic light emitting material layer 201 disposed between the first electrode 101 and the second electrode 202; and a first insulating layer 102 and a second insulating layer 103 sequentially formed from bottom to top above the active layer 108 and the first electrode 101 of the OLED. The first insulating layer 102 is a lyophilic layer, and the second insulating layer 103 is a lyophobic layer. The active layer 108 and the first electrode 101 of the OLED are in a same layer and made of a same material. An accommodation cavity 104 exposing the first electrode to the organic light emitting material layer 201 is formed in the first insulating layer 102 and the second insulating layer 103, and the accommodation cavity 104 is used for accommodating the organic light emitting material layer 201.

Because the active layer 108 and the first electrode 101 are in the same layer and made of the same material, they may be formed in one patterning process, which can decrease the number of patterning processes in the process of manufacturing the OLED array substrate 200, and improve manufacturing efficiency and yield.

In addition, because a composite structure of a lyophilic layer and a lyophobic layer formed by the first insulating layer 102 and the second insulating layer 103 is used, the flatness of the organic light emitting material layer in the OLED array substrate 200 according to the embodiment of the present invention can be improved, and the solution containing the organic light emitting material (e.g., droplets of the organic light emitting material jetted from an inkjet printing apparatus), which is injected into the accommodation cavity to form the organic light emitting material layer, can uniformly spread in the accommodation cavity 104, so as to alleviate defects such as Mura, coffee ring or the like. To achieve better effect, the second insulating layer 103 may be formed to have a thickness much smaller than that of the first insulating layer 102. For example, the thickness of the second insulating layer 103 does not exceed ¼ of the thickness of the first insulating layer 102.

As an example, the first insulating layer 102 may be an etch stop layer, and the second insulating layer 103 may be a pixel define layer. In an example, an angle between liquid level of the solution containing the organic light emitting material, which is injected into the accommodation cavity to form the organic light emitting material layer, and the plane in which the surface of the etch stop layer is located is smaller than 0 degree, and an angle between the liquid level of the solution containing the organic light emitting material, which is injected into the accommodation cavity to form the organic light emitting material layer, and the plane in which the surface of the pixel define layer is larger than 30 degrees.

In an example, the thin film transistor 211 may further include: a source 109 and a drain 110 above the first insulating layer (e.g., the etch stop layer) 102, wherein, the source and the drain are respectively electrically connected to the active layer 108 through a first via hole 139 and a second via hole 140 penetrating through the first insulating layer 102, and the drain 110 is also electrically connected to the first electrode 101 of the OLED through a third via hole 141 penetrating through the first insulating layer 102; a gate 107 above or below the active layer 108; and a gate insulating layer 105 between the active layer 108 and the gate 107. Thus, parts of the thin film transistor 211 other than the active layer 108 can be formed conveniently. The thin film transistor 211 can be used to control a voltage of an electrode layer of the OLED when a display element operates, for example, to drive the organic light emitting material to emit light or stop light-emission.

In an example, as shown in FIGS. 3 and 5, the OLED array substrate 200 may further include a base substrate 106, the gate 107 is on the base substrate 106, and the gate insulating layer 105 is arranged to separate the gate 107 and a part of the base substrate 106 without the gate 107 covering thereon from the active layer 108 and the first electrode 101.

In another example, as shown in FIG. 4, the OLED array substrate 200' may further include a base substrate 106, the active layer 108 and the first electrode 101 are on the base substrate 106, and the gate insulating layer 105 is above the active layer 108 and the first electrode 101 and forms the accommodation cavity 104 together with the first insulating layer 102 and the second insulating layer 103. Thus, the accommodation cavity 104 may be formed by etching the first insulating layer 102, the second insulating layer 103 and the gate insulating layer 105, and the process is simplified.

In an example, the OLED array substrate 200 according an embodiment of the present invention may further include an upper-lower electrode connection structure 111, as shown in FIGS. 3, 4 and 5. The upper-lower electrode connection structure 111 includes a lower electrode 1111, an upper electrode 1112 and a contact hole 1113 connecting the two electrodes 1111 and 1112. The lower electrode 1111 may be arranged in the same layer as the gate 107. The upper-lower electrode connection structure 111 may be used for providing power to each electrode in the OLED array substrate.

As an example, the first electrode 101, the gate insulating layer 105 and the base substrate 106 may all be light-transmissive, so as to allow light emitted, under the effect of a voltage, from the organic light emitting material accommodating in the accommodation cavity 104 to be emitted out from the first electrode 101.

As an example, as shown in FIG. 5, a reflective layer 120 is provided on the base substrate 106 below the gate insulating layer 105, and the reflective layer 120 is opposite to the bottom of the accommodation cavity 104. The reflective layer 120 can reflect light emitted from the organic light emitting material to the bottom (for example, passing through the first electrode 101 of the OLED) towards the top of the OLED. As an example, the reflective layer 120 may be made of a metal material, such as aluminum, an aluminum silver alloy, molybdenum, a molybdenum alloy, or the like. Arrows in FIGS. 3 to 5 indicate light emitting directions. To simplify the process, in an example, the reflective layer 120 and the gate 107 may be formed in a same layer and made of a same material.

As an example, an angle between the wall of the accommodation cavity 104 and a direction perpendicular to the first electrode 101 of the OLED may be smaller than 30 degrees. In this way, an ink droplet accommodation unit such as the accommodation cavity can be easily manufactured, and short-circuit can hardly occur.

It should be noted that in order to meet the operating requirement of the OLED better, a hole transport layer and a hole injection layer may further be provided between the first electrode 101 and the organic light emitting material layer 201 of the OLED, and an electron transport layer and an electron injection layer may further be provided between the organic light emitting material layer 201 and the second electrode 202.

In the embodiments of the present invention, the first electrode 101 may be the anode of the OLED, and the second electrode 202 may be the cathode of the OLED, and vice versa.

In order to meet the function requirements of the OLED array substrate 200, an element such as a capacitor 119 (as shown by the left dashed box in FIG. 3, 4, or 5) may also be provided in the OLED array substrate 200.

In the embodiments of the present invention, the accommodation cavity 104 may accommodate an organic light emitting material, required by the OLED display apparatus to work, of any color such as red, blue, green, or the like.

Embodiments of the present invention further provide an OLED display apparatus including the OLED array substrate 200 described in any one of the above embodiments.

It should be noted that the OLED display apparatus provided by the embodiments of the present invention may be a WOLED (white organic light emitting diode) display apparatus, a POLED (polymer organic light emitting diode) display apparatus, or the like.

In addition, the OLED display apparatus in the embodiments may be any product or component having a display function such as an OLED display panel, a mobile phone, a tablet computer, a television, a monitor, a notebook computer, a digital photo frame, a navigator, or the like.

The present invention is described in conjunction with the accompanying drawings, but the embodiments disclosed in the accompanying drawings are intended to exemplarily illustrate the preferred implementations of the present invention and shall not be construed as a limitation to the present invention.

What is claimed is:

1. A manufacturing method of an organic light emitting diode array substrate, the organic light emitting diode array substrate comprising a thin film transistor and an organic light emitting diode, the method comprising steps of:
    forming an oxide semiconductor layer by a film forming process, and performing one patterning process on the oxide semiconductor layer to form an active layer of the thin film transistor and a first electrode of the organic light emitting diode;
    sequentially forming a first insulating layer and a second insulating layer on the active layer and the first electrode of the organic light emitting diode, the first insulating layer being a lyophilic layer, and the second insulating layer being a lyophobic layer;
    forming an accommodation cavity exposing the first electrode by performing a patterning process on the first insulating layer and the second insulating layer; and
    injecting a solution containing an organic light emitting material into the accommodation cavity and performing a drying process to form an organic light emitting material layer,
    wherein after forming the first insulating layer and before forming the second insulating layer, the method further comprises a step of:
    forming a source and a drain on the first insulating layer such that the source and the drain are respectively electrically connected to the active layer through a first via hole and a second via hole penetrating through the first insulating layer, and the drain is further electrically connected to the first electrode of the organic light emitting diode through a third via hole penetrating through the first insulating layer; and
    in the step of forming an accommodation cavity exposing the first electrode by performing a patterning process on the first insulating layer and the second insulating layer, the first insulating layer and the second insulating layer are etched together.

2. The manufacturing method of claim 1, further comprising, after the step of forming an accommodation cavity, and before the step of injecting a solution containing an organic light emitting material into the accommodation cavity and performing a drying process to form an organic light emitting material layer, a step of:
    performing an overexposure treatment on the first electrode formed in the same layer as the active layer through the accommodation cavity to improve conductivity thereof.

3. The manufacturing method of claim 2, wherein wavelength of light used in the overexposure treatment is in the range of 200 nm to 400 nm, and time for performing the overexposure treatment is between 0.5 minutes to 2 minutes.

4. The manufacturing method of claim 2, wherein a surface of the first electrode subjected to the overexposure treatment has lyophilic property.

5. The manufacturing method of claim 1, wherein an angle between liquid level of the solution containing the organic light emitting material and a plane in which a surface of the first insulating layer is located is smaller than 0 degree; and the first insulating layer is made of silicon oxide or aluminum oxide.

6. The manufacturing method of claim 1, wherein an angle between liquid level of the solution containing the organic light emitting material and a plane in which a surface of the second insulating layer is located is larger than 30 degrees; and the second insulating layer is made of an organic fluoride material.

7. The manufacturing method of claim 1, wherein, before the step of forming an oxide semiconductor layer by a film forming process, and performing one patterning process on the oxide semiconductor layer to form an active layer of the thin film transistor and a first electrode of the organic light emitting diode, the method further comprises steps of:
    forming a gate of the thin film transistor on a base substrate; and
    forming a gate insulating layer on the gate and a part of the base substrate without the gate covering thereon, the active layer and the first electrode being formed on the gate insulating layer.

8. The manufacturing method of claim 1, further comprising, after the step of forming an oxide semiconductor layer by a film forming process, and performing one patterning process on the oxide semiconductor layer to form an active layer of the thin film transistor and a first electrode of the organic light emitting diode, and before forming the first insulating layer, steps of:
    forming a gate insulating layer on the active layer of the thin film transistor, the first electrode of the organic light emitting diode, and a part of a base substrate without the active layer of the thin film transistor and the first electrode of the organic light emitting diode covering thereon; and
    forming a gate on the gate insulating layer; wherein the source and the drain are respectively electrically connected to the active layer through a first via hole and a second via hole penetrating through the first insulating layer and the gate insulating layer, and the drain is further electrically connected to the first electrode of the organic light emitting diode through a third via hole penetrating through the first insulating layer and the gate insulating layer,
    wherein in the step of forming an accommodation cavity exposing the first electrode by performing a patterning process on the first insulating layer and the second insulating layer, the patterning process is performed on the first insulating layer, the second insulating layer and the gate insulating layer to form the accommodation cavity exposing the first electrode.

9. The manufacturing method of claim 8, wherein the gate insulating layer has lyophilic property.

10. The manufacturing method of claim 1, wherein thickness of the second insulating layer is no larger than ¼ of thickness of the first insulating layer.

11. The manufacturing method of claim 1, wherein the first insulating layer is an etch stop layer, and the second insulating layer is a pixel define layer.

12. An organic light emitting diode array substrate, comprising:
    a thin film transistor having an active layer;
    an organic light emitting diode comprising a first electrode, a second electrode and an organic light emitting material layer disposed between the first electrode and the second electrode; and
    a first insulating layer and a second insulating layer sequentially formed from bottom to top above the active layer and the first electrode of the organic light emitting diode, the first insulating layer being a lyophilic layer, and the second insulating layer being a lyophobic layer; wherein the active layer and the first electrode of the organic light emitting diode are in a same layer and made of a same material; and an accommodation cavity exposing the first electrode to the organic light emitting material layer is formed in the first insulating layer and the second insulating layer, and the accommodation cavity is used for accommodating the organic light emitting material layer; and the thin film transistor further comprises:

a source and a drain above the first insulating layer, wherein the source and the drain are respectively electrically connected to the active layer through a first via hole and a second via hole penetrating through the first insulating layer, and the drain is further electrically connected to the first electrode of the organic light emitting diode through a third via hole penetrating through the first insulating layer;

a gate above or below the active layer; and a gate insulating layer between the active layer and the gate wherein both the active layer and the first electrode of the organic light emitting diode are directly on the gate insulating layer.

13. The organic light emitting diode array substrate of claim 12, wherein the first insulating layer is made of silicon oxide or aluminum oxide; and the second insulating layer is made of an organic fluoride material.

14. The organic light emitting diode array substrate of claim 12, further comprising a base substrate, the gate is on the base substrate, and the gate insulating layer is arranged to separate the gate and a part of the base substrate without the gate covering thereon from the active layer and the first electrode.

15. The organic light emitting diode array substrate of claim 12, further comprising a base substrate, the active layer and the first electrode are on the base substrate, and the gate insulating layer is above the active layer and the first electrode and forms the accommodation cavity together with the first insulating layer and the second insulating layer.

16. The organic light emitting diode array substrate of claim 12, wherein thickness of the second insulating layer is no larger than ¼ of thickness of the first insulating layer.

17. The manufacturing method of claim 12, wherein the first insulating layer is an etch stop layer, and the second insulating layer is a pixel define layer.

18. An organic light emitting diode display apparatus, comprising:

the organic light emitting diode array substrate of claim 12.

* * * * *